United States Patent
Tseng et al.

(10) Patent No.: US 10,361,139 B2
(45) Date of Patent: Jul. 23, 2019

(54) SEMICONDCUTOR PACKAGE AND MANUFACTURING METHOD THEREOF

(71) Applicant: Taiwan Semiconductor Manufacturing Co., Ltd., Hsinchu (TW)

(72) Inventors: Shih-Hao Tseng, Hsinchu (TW); Hung-Jui Kuo, Hsinchu (TW); Ming-Che Ho, Tainan (TW); Chia-Hung Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/884,397

(22) Filed: Jan. 31, 2018

(65) Prior Publication Data
US 2019/0148255 A1 May 16, 2019

Related U.S. Application Data

(60) Provisional application No. 62/587,454, filed on Nov. 16, 2017.

(51) Int. Cl.
| | |
|---|---|
| *H01L 23/495* | (2006.01) |
| *H01L 23/31* | (2006.01) |
| *H01L 23/498* | (2006.01) |
| *H01L 21/48* | (2006.01) |
| *H01L 21/56* | (2006.01) |
| *H01L 23/00* | (2006.01) |

(52) U.S. Cl.
CPC ...... *H01L 23/3128* (2013.01); *H01L 21/4853* (2013.01); *H01L 21/561* (2013.01); *H01L 21/568* (2013.01); *H01L 23/49811* (2013.01); *H01L 23/49827* (2013.01); *H01L 24/11* (2013.01); *H01L 24/14* (2013.01); *H01L 24/17* (2013.01); *H01L 24/81* (2013.01); *H01L 24/97* (2013.01)

(58) Field of Classification Search
CPC ............. H01L 21/561; H01L 23/49503; H01L 23/49816; H01L 21/568; H01L 21/56; H01L 21/563; H01L 23/3128; H01L 23/49811; H01L 23/28; H01L 23/49513; H01L 23/49827; H01L 21/4853; H01L 23/49844
USPC ........................................................ 257/673
See application file for complete search history.

(56) References Cited

U.S. PATENT DOCUMENTS

2011/0068468 A1* 3/2011 Lin ................... H01L 23/49816
257/737
2014/0339548 A1* 11/2014 Yamazaki ........... H01L 29/7869
257/43

* cited by examiner

*Primary Examiner* — Theresa T Doan
(74) *Attorney, Agent, or Firm* — JCIPRNET

(57) ABSTRACT

A semiconductor package includes an encapsulated semiconductor device, a redistribution structure, and a protection layer. The encapsulated semiconductor device includes a semiconductor device and an encapsulating material encapsulating the semiconductor device. The redistribution structure is disposed on the encapsulated semiconductor device and includes a dielectric layer and a redistribution circuit layer electrically connected to the semiconductor device. The protection layer at least covers the dielectric layer, wherein an oxygen permeability or a water vapor permeability of the protection layer is substantially lower than an oxygen permeability or a vapor permeability of the dielectric layer.

20 Claims, 7 Drawing Sheets

SEMICONDCUTOR PACKAGE AND MANUFACTURING METHOD THEREOF

CROSS-REFERENCE TO RELATED APPLICATION

This application claims the priority benefit of U.S. provisional application Ser. No. 62/587,454, filed on Nov. 16, 2017. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
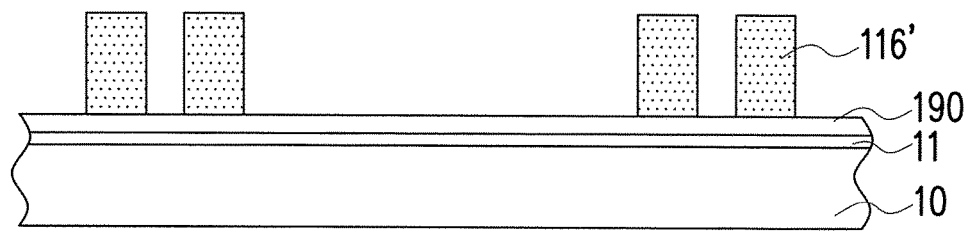
FIG. 1 to FIG. 8 are schematic cross sectional views of various stages in the manufacturing process of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

FIG. 1 to FIG. 8 are schematic cross sectional views of various stages in the manufacturing process of a semiconductor package according to some exemplary embodiments of the present disclosure. In exemplary embodiments, the semiconductor manufacturing process may be part of a wafer level packaging process. In some embodiments, one die is shown to represent plural dies of the wafer, and one single package is shown to represent plural semiconductor packages obtained following the semiconductor manufacturing process. The manufacturing process of the semiconductor package 100 shown in FIG. 8 may include the following steps. Referring to FIG. 1, in some embodiments, a carrier 10 is provided. The carrier 10 may be a glass carrier or any suitable carrier for the manufacturing process of the semiconductor package 100. In some embodiments, the carrier 10 may be coated with a de-bonding layer 11. The material of the debond layer may be any material suitable for de-bonding the carrier 10 from the above layers disposed thereon. For example, the de-bonding layer 11 may be a ultra-violet (UV) curable adhesive, a heat curable adhesive, an optical clear adhesive or a light-to-heat conversion (LTHC) adhesive, or the like, although other types of de-bonding layer may be used. In addition, the de-bonding layer 11 may be also adapted to allow light or signal to pass through. It is noted that the materials of the de-bonding layer 11 and the carrier 10 are merely for illustration, and the disclosure is not limited thereto.

In some embodiments, the carrier 10 may further include a dielectric layer 190 formed thereon. The dielectric layer 190 may be a polybenzoxazole (PBO) layer formed on the de-bonding layer 11, for example. It is noted that, in some embodiments, the dielectric layer 190 may be omitted. In other words, the formation of the dielectric layer 190 is optional in some alternative embodiments.

Then, a plurality of conductive pillars 116' are formed on the carrier 10. In some embodiments, the conductive pillars 116' are formed over the carrier 10 (e.g. on the dielectric layer 190, or on the de-bonding layer 11 if the dielectric layer 190 is omitted) by photolithography, plating, and photoresist stripping process, etc. In some alternative embodiments, the conductive pillars 116' may be pre-fabricated through other processes and are mounted over the carrier 10. For example, the conductive pillars 116' may be copper posts or other metallic posts.

Figure 2:
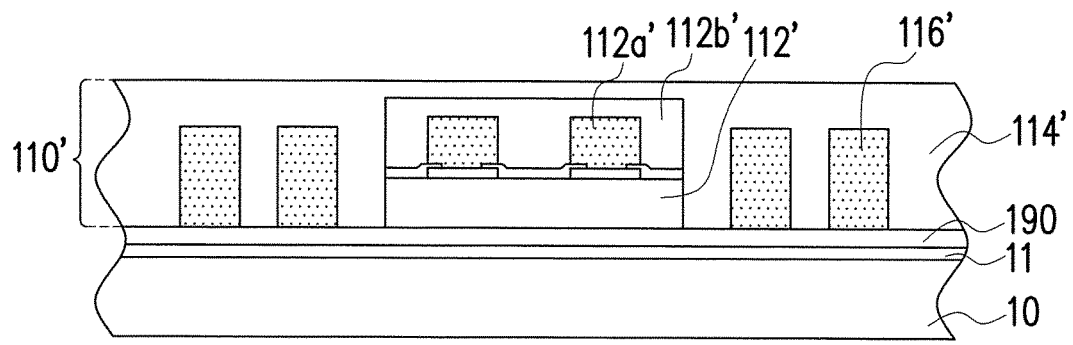

Referring to FIG. 2, in some embodiments, at least one semiconductor device 112' may be disposed on the carrier 10. The semiconductor device 112' may be attached or adhered over the carrier 10 (e.g. on the dielectric layer 190, or on the de-bonding layer 11 if the dielectric layer 190 is omitted) through a die attach film (not shown), an adhesion paste or the like. The semiconductor device 112' may include a plurality of electrical terminals 112a' disposed on an active surface of the semiconductor device 112' and an insulation layer 112b' covering the electrical terminals 112a'. In some alternative embodiments, the insulation layer 112b' may expose the electrical terminals 112a'. In the present embodiment, the semiconductor device 112' is disposed on the carrier 10 with the active surface facing away from the carrier 10 (i.e. facing up). In some alternative embodiments, more than one of the semiconductor devices 112' may be disposed on the carrier 10. The disclosure does not limit the number of the semiconductor device 112'. In some embodiments, the conductive pillars 116' are arrange aside and around the semiconductor device 112'.

Then, an encapsulating material 114' is formed on the carrier 10 and encapsulates the semiconductor device 112' and the conductive pillars 116'. In some embodiments, the encapsulating material 114' fills the gaps between the semiconductor device 112' and the conductive pillars 116', and covers the carrier 10. In some embodiments, the encapsulating material 114' is a single-layered encapsulating material, which may include a molding compound formed by a molding process. The material of the encapsulating material 114' may include epoxy or other suitable resins. For example, the encapsulating material 114' may be epoxy resin containing chemical filler. In some embodiments, the encapsulating material 114' is formed over the semiconductor device 112' and covers the top surfaces of the conductive pillars 116' and the active surface of the semiconductor device 112', so as to form an encapsulated semiconductor device 110' on the carrier 10.

Figure 3:
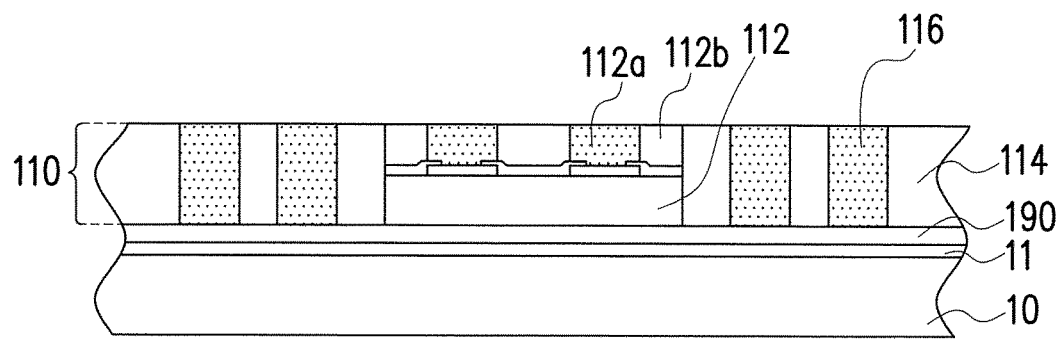

Referring to FIG. 3, in some embodiments, the encapsulating material 114' is planarized to reveal the conductive pillars 116' and the semiconductor device 112'. In some embodiment, the top surface of the encapsulated semiconductor device 110' are ground and polished until the conductive pillars 116' and the electrical terminals 112a' of the semiconductor device 112' are revealed. After the encapsulating material 114' is ground, an encapsulated semiconductor device 110 as shown in FIG. 3 is formed on the carrier 10. The encapsulated semiconductor device 110 may have a wafer form in the process. In some embodiments, during the grinding process of the encapsulating material 114, top portions of the conductive pillars 116', the insulation layer 112b' and the electrical terminals 112a' are also ground to form the encapsulated semiconductor device 110. Accordingly, a ground surface of the encapsulating material 114 is substantially coplanar with the top surfaces of the conductive pillars 116 and the electrical terminals 112a of the semiconductor device 112. In some embodiments, the insulation layer 112b' is also ground to form the insulation layer 112b for revealing the electrical terminals 112a underneath.

In some embodiments, the encapsulated semiconductor device 110 includes a semiconductor device 112 and an encapsulating material 114 encapsulating the semiconductor device 112 and the conductive pillars 116 as shown in FIG. 3. The encapsulating material 114 reveals the electrical terminals 112a of the semiconductor device 112 and the top surfaces of the conductive pillars 116. The grinding process of the encapsulating material 114 may include mechanical grinding or chemical mechanical polishing (CMP), for example. After the grinding process, a cleaning step may be optionally performed, for example, to clean and remove the residue generated from the grinding step. However, the disclosure is not limited thereto, and the planarizing step may be performed through any other suitable method.

Figure 4:
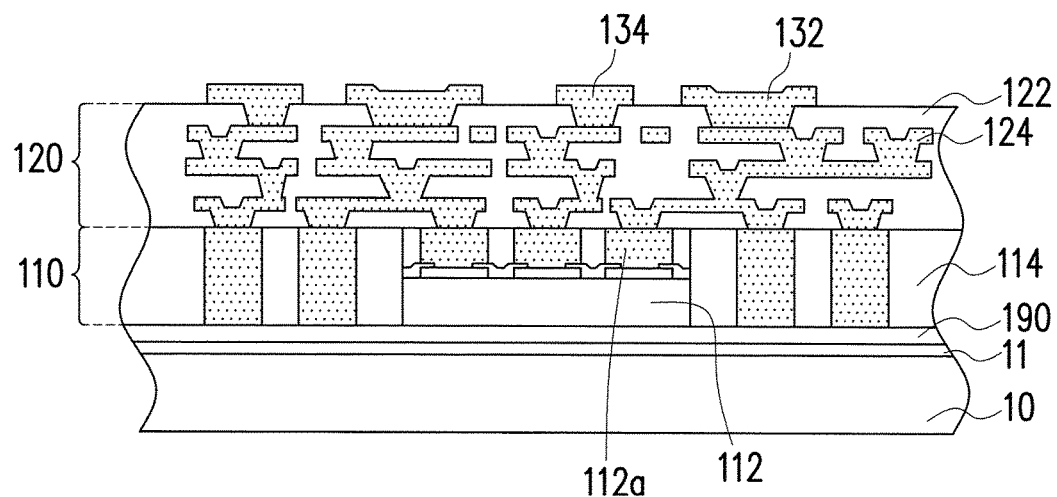

Referring to FIG. 4, a redistribution structure 120 is formed on the encapsulated semiconductor device 110. In some embodiments, the redistribution structure 120 is formed on the encapsulating material 114 and semiconductor device 112. The redistribution structure 120 is electrically connected to the conductive pillars 116 and the electrical terminals 112a of the semiconductor device 112. In some embodiments, a plurality of dielectric layers and a plurality of redistribution circuit layers may be stacked on top of one another alternately to form the redistribution structure 120 shown in FIG. 4. The redistribution structure 120 at least includes a dielectric layer 122 and a redistribution circuit layer 124 electrically connected to the semiconductor device 112. In one of the implementations, the dielectric layer 122 is the topmost dielectric layer of the redistribution structure 120. In addition, the dielectric layer 122 is disposed on the redistribution circuit layer 124 and reveals a part of the redistribution circuit layer 124. In some embodiments, the thickness of the dielectric layer 122 substantially ranges from 2 μm to 10 μm. The material of the dielectric layer 122 of the redistribution structure 120 may include organic polymer such as, but not limited to, polyimide, etc. The material of the redistribution circuit layer 124 may include copper, or any other suitable materials. Then, in some embodiments, an under bump metallization layer 132 and at least one connecting pad 134 are formed on the part of the redistribution circuit layer 124 revealed by the dielectric layer 122. The under bump metallization layer 132 and the connecting pad 134 may be formed by sputtering, evaporation, or electroless plating, etc.

Figure 5:
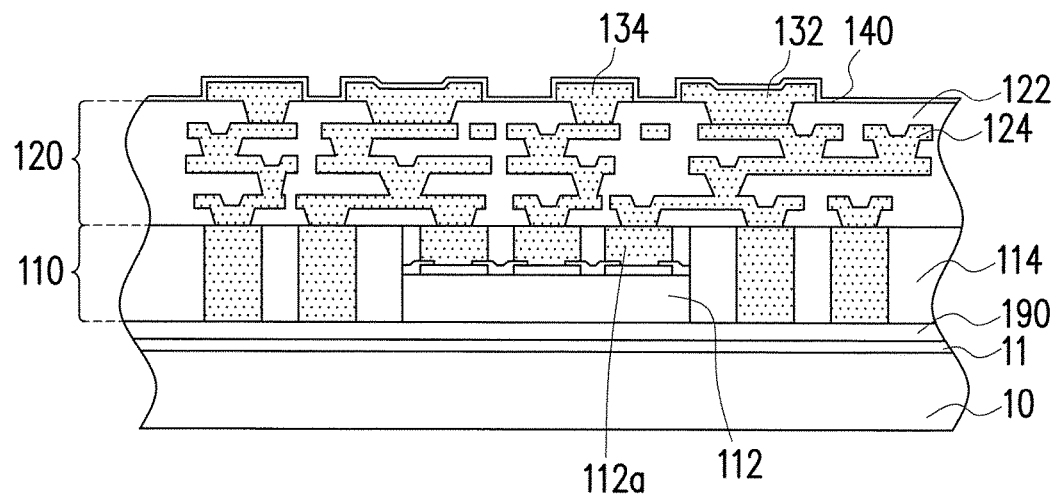

Referring to FIG. 5, a protection layer 140 is formed on an upper surface of the redistribution structure 120. The protection layer 140 at least covers the dielectric layer 122. In one of the implementations, the protection layer 140 is formed on the dielectric layer 122, the under bump metallization layer 132 and the connecting pad 134. In other words, the protection layer 140 covers the upper surface of the redistribution structure 120 entirely, including top surfaces of the under bump metallization layer 132, the connecting pad 134 and the dielectric layer 122. In some embodiments, an oxygen permeability and/or a water vapor permeability of the protection layer 140 is substantially lower than an oxygen permeability and/or a vapor permeability of the dielectric layer 122. Therefore, the protection layer 140 is configured to prevent oxygen and/or water vapor, which could have permeated through the dielectric layer 122, from contacting the redistribution circuit layer 124 underneath and forming copper oxide on the surface of the redistribution circuit layer 124, which would lead to delamination between the dielectric layer 122 and the redistribution circuit layer 124. Accordingly, the configuration of the protection layer 140 can prevent the formation of copper oxide and the delamination between the dielectric layer 122 and the redistribution circuit layer 124, so as to improve yield rate of the semiconductor package 100.

In general, the oxygen and/or water vapor permeability of an inorganic material is usually lower than the oxygen and/or water vapor permeability of an organic material. Accordingly, in some embodiments, the protection layer 140 may be an inorganic protection layer 140. For example, the protection layer 140 may include inorganic material such as, but not limited to, aluminum oxide ($Al_2O_3$), silicon dioxide ($SiO_2$), or silicon nitride ($SiN_x$). In some embodiments, the protection layer 140 is formed by atomic layer deposition process, and the thickness of the protection layer 140 ranges from 100 Angstrom (Å) to 200 Å, which is much thinner than the thickness of the dielectric layer 122. In one embodiment, the thickness of the protection layer 140 is about 150 Å.

Figure 6:
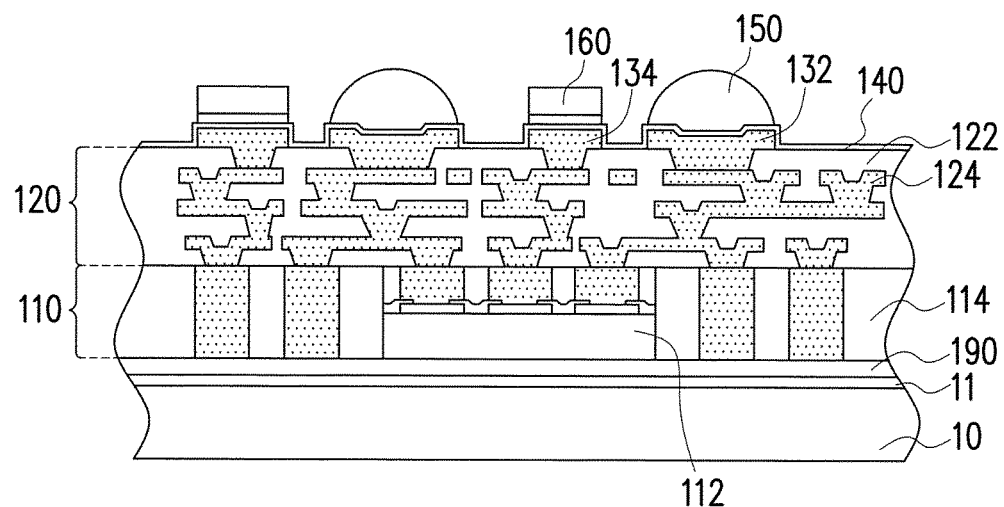

Referring to FIG. 6, in some embodiments, at least one conductive bump 150 is formed on the under bump metallization layer 132, and at least one integrated passive device (IPD) 160 is formed on the connecting pad 134. The conductive bump 150 and the IPD 160 are electrically connected to the redistribution circuit layer 124. The formation of the conductive bump 150 may include placing solder balls on the under bump metallization layer 132, and then reflowing the solder balls. In alternative embodiments, the formation of the conductive bump 150 may include performing a plating process to form solder regions on the under bump metallization layer 132, and then reflowing the solder regions. The conductive bump 150 may also include conductive pillars, or conductive pillars with solder caps, which may also be formed through plating. The IPD 160 may be fabricated using standard wafer fabrication technologies such as thin film and photolithography processing, and may be mounted on the connecting pad 134 through, for example, flip-chip bonding or wire bonding, etc. In the present embodiment, the protection layer 140 is located between the conductive bump 150 and the under bump metallization layer 132, and located between the IPD 160 and the connecting pad 134. Since the thickness of the protection layer 140 is extremely thin, e.g. about 100 Å~200 Å, the conductive bump 150 and the IPD 160 can still be electrically connected to the under bump metallization layer 132 and the connecting pad 134 respectively due to current diffusion.

Figure 6A:
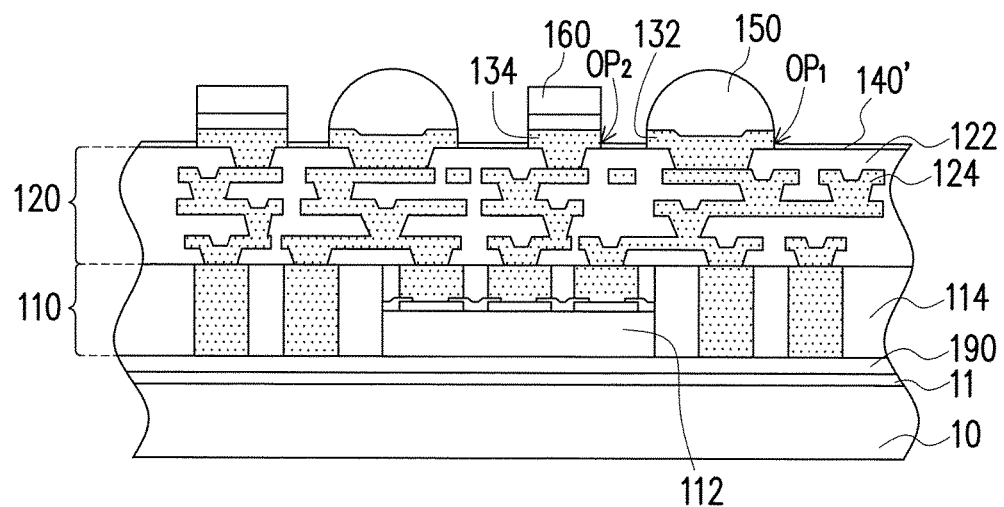

FIG. 6A is a schematic cross sectional view of one of various stages in the manufacturing process of a semiconductor package according to another exemplary embodiment of the present disclosure. It is noted that the structure shown in FIG. 6A contains many features same as or similar to the structure disclosed earlier with FIG. 6. For purpose of clarity and simplicity, detail description of same or similar features may be omitted, and the same or similar reference numbers denote the same or like components. The main differences between the structure shown in FIG. 6A and the structure shown in FIG. 6 are described as follows.

In the present embodiment, the protection layer 140' covers the dielectric layer 122 and includes at least one opening OP I revealing the under bump metallization layer 132. In some embodiments, the protection layer 140' may include a plurality of openings OP1, OP2 for revealing the under bump metallization layer 132 and the connecting pads 134. In some embodiments, the openings OP1, OP2 of the protection layer 140' can be formed by, for example, etching process, etc. Then, at least one conductive bump 150 and at least one IPD 160 are formed on the under bump metallization layer 132 and the connecting pad 134 revealed by the openings OP1, OP2. The conductive bump 150 and the IPD 160 are electrically connected to the redistribution circuit layer 124. The formation of the conductive bump 150 and the IPD 160 may be the same as that of the conductive bump 150 and the IPD 160 described in FIG. 6. In the present embodiment, the conductive bump 150 and the under bump metallization layer 132 are in direct contact. Similarly, the IPD 160 and the connecting pad 134 are also in direct contact. Thereby, the electrical performance of the semiconductor package can be enhanced.

Figure 7:
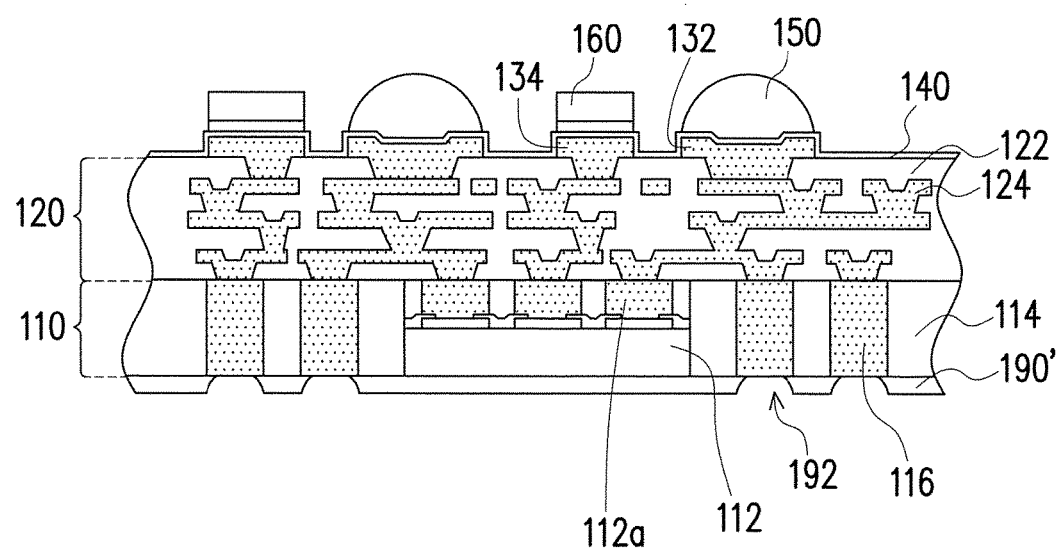
Figure 8:
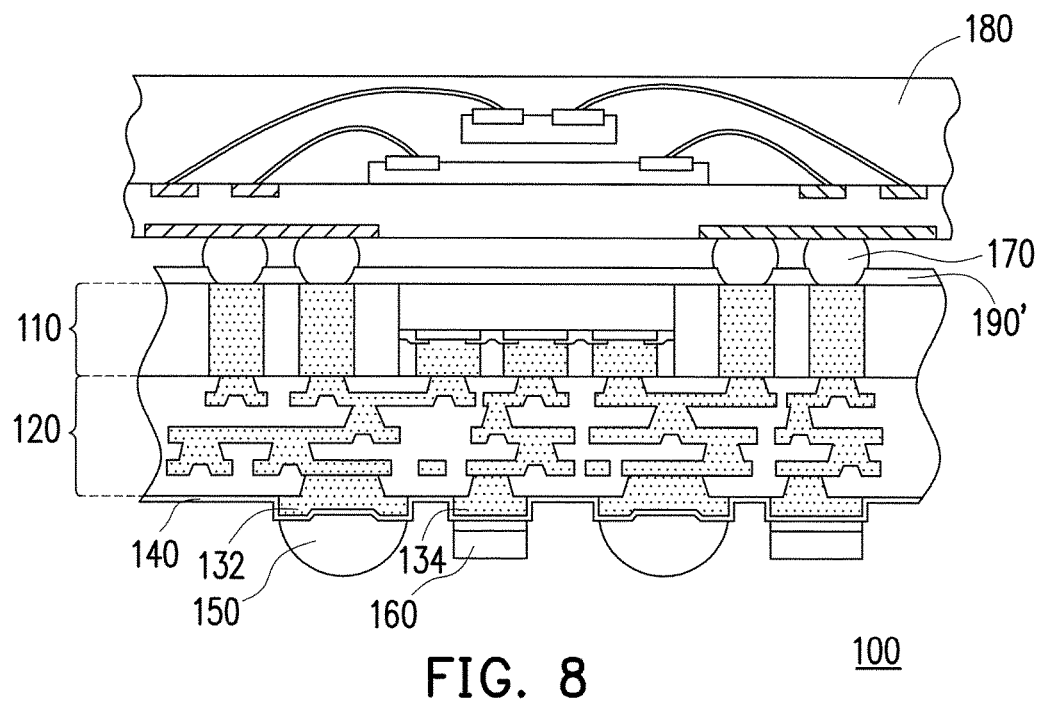

Referring to FIG. 7, the carrier 10 may be removed. It is noted that FIG. 7 to FIG. 8 illustrate the subsequent stages after the stage shown in FIG. 6 in the manufacturing process of the semiconductor package. However, it should be well understood that the manufacturing process illustrated in FIG. 7 to FIG. 8 may also be applied to the resultant structure illustrated in FIG. 6A. In some embodiments, the carrier 10 is detached from the encapsulated semiconductor device 110 and the dielectric layer 190 (if any), by causing the de-bonding layer 11 to lose or reduce adhesion. The de-bonding layer 11 is then removed along with the carrier 10. For example, the de-bonding layer 11 may be exposed to UV light, so that the de-bonding layer 11 loses or reduces adhesion, and hence the carrier 10 and the de-bonding layer 11 can be removed from the encapsulated semiconductor device 110 and the dielectric layer 190 (if any).

In the embodiments of having the dielectric layer 190, a patterning process may then be performed on the dielectric layer 190 to form a plurality of openings 192. Accordingly, the dielectric layer 190' having a plurality of openings 192 are formed. The openings 192 are located on the conductive pillars 116 respectively to reveal the bottom ends of the conductive pillars 116. In some embodiments, the openings 192 may be formed by photolithography process, laser drilling process, etc.

Referring to FIG. 8, a plurality of conductive bumps 170 may be formed on the encapsulated semiconductor device 110 to be electrically connected to the conductive pillars 116. In some embodiments, the conductive bumps 170 are disposed in the openings 192 of the dielectric layer 190' to be connected to the conductive pillars 116. Then, another semiconductor device 180 is disposed on the conductive bumps 170, and is electrically connected to the conductive pillars 116 through the conductive bumps 170. In other words, the semiconductor device 180 is mounted on the encapsulated semiconductor device 110 through the conductive bumps 170. In some embodiments, the semiconductor device 180 may be packages, device dies, passive devices, and/or the like. In some embodiments, the semiconductor package 100 may combine vertically discrete memory and logic packages, and the semiconductor device 180 may be employed in a memory such as Dynamic Random Access Memory and others, but the disclosure is not limited thereto.

In some embodiments, the bonding of the semiconductor device 180 may be performed using flip chip bonding through the conductive bumps 170, which may comprise solder, for example. In some embodiments, an underfill (not shown) may be formed between the encapsulated semiconductor device 110 and the semiconductor device 180 to encapsulate the conductive bumps 170. It is appreciated that semiconductor device 112 in the encapsulated semiconductor device 110 and the semiconductor device 180 may be arranged differently than in the illustrated exemplary embodiments. Then, the wafer-level package may then be sawed into a plurality of semiconductor packages 100 independent from one another. At the time, the manufacturing process of the semiconductor package 100 may be substantially done.

Figure 8A:
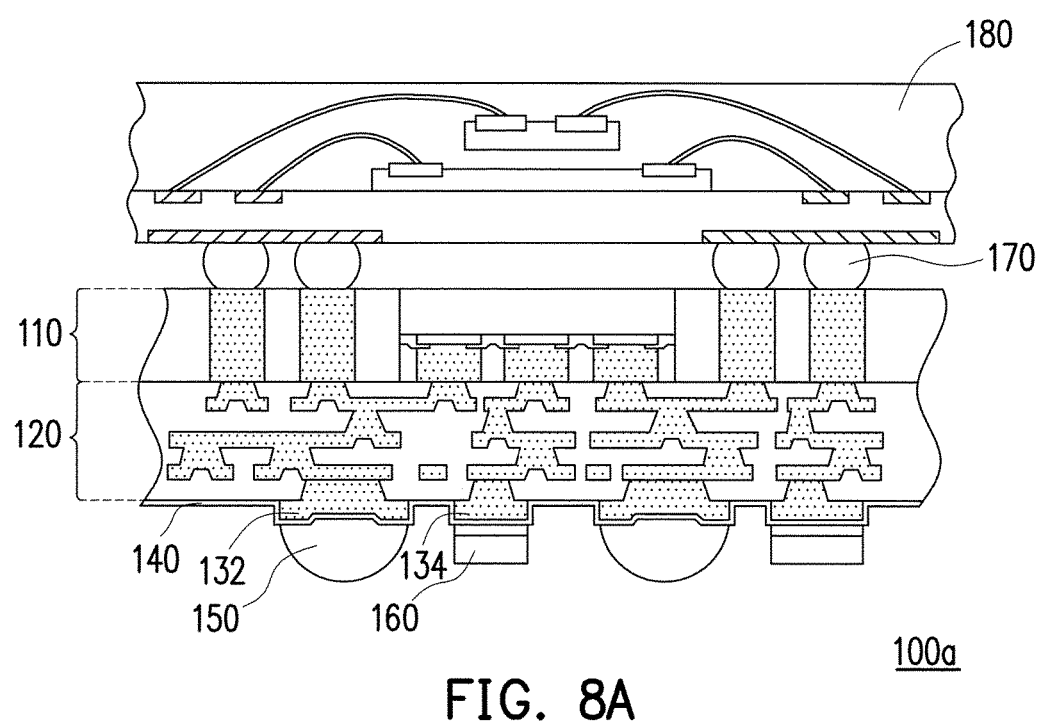
FIG. 8A illustrates a cross sectional view of a semiconductor package according to some exemplary embodiments of the present disclosure.

FIG. 8A illustrates a cross sectional view of a semiconductor package according to some exemplary embodiments of the present disclosure. It is noted that the semiconductor package 100a shown in FIG. 8A contains many features same as or similar to the semiconductor package 100 disclosed earlier with FIG. 8. For purpose of clarity and simplicity, detail description of same or similar features may be omitted, and the same or similar reference numbers denote the same or like components. The main differences between the semiconductor package 100a shown in FIG. 8A and the semiconductor package 100 shown in FIG. 8 are described as follows.

As mentioned earlier, the step of forming the dielectric layer 190 on the carrier 10 is optional. Accordingly, in the embodiments of not having the dielectric layer 190 on the carrier 10 as shown in FIG. 8A, after the carrier 10 is removed, the bottom ends of the conductive pillars 116 are revealed. The bottom ends of the conductive pillars 116 are level with the bottom surface of the semiconductor device 112 and the bottom surface of the encapsulating material 114. In the embodiments of the dielectric layer 190 being omitted, a grinding process may be performed to lightly grind the back surface of encapsulated semiconductor device 110 after the carrier 10 is removed. Alternatively, the grinding process may be skipped. Accordingly, in the semiconductor package 100a shown in FIG. 8A, the conductive bumps 170 are disposed directly on the conductive pillars 116 for the semiconductor device 180 to be mounted thereon.

FIG. 9 to FIG. 12 are schematic cross sectional views of various stages in the manufacturing process of a semiconductor package according to some exemplary embodiments of the present disclosure. It is noted that the manufacturing process of the semiconductor package 200 shown in FIG. 9 to FIG. 12 contains many features same as or similar to the manufacturing process of the semiconductor package 100 disclosed earlier with FIG. 1 to FIG. 8. The structure shown in FIG. 9 may be corresponding to the structure shown in FIG. 4, and similar reference numbers denote similar components. For purpose of clarity and simplicity, detail description of same or similar features may be omitted.

Figure 9:
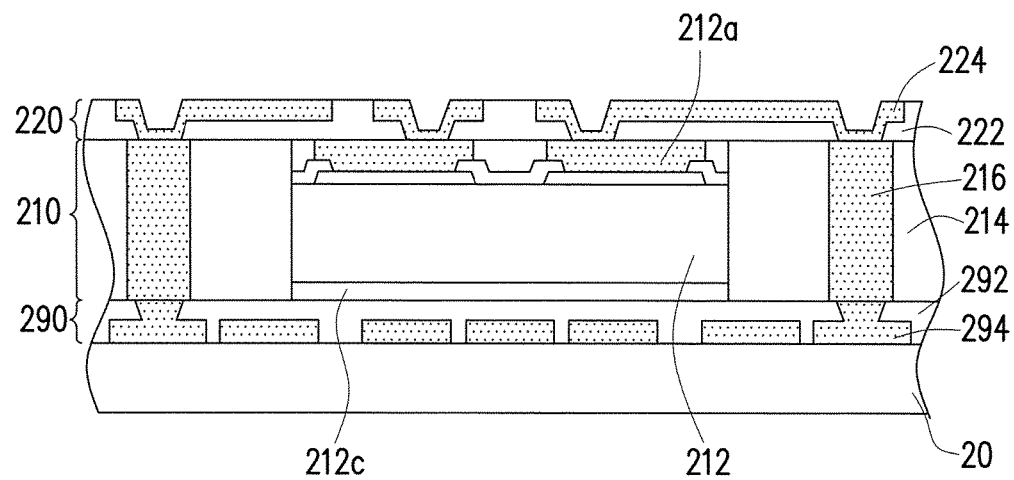
FIG. 9 to FIG. 12 are schematic cross sectional views of various stages in the manufacturing process of a semiconductor package according to some exemplary embodiments of the present disclosure.

Referring to FIG. 9, the redistribution structure 220 is formed on the encapsulated semiconductor device 210. In some embodiments, the encapsulated semiconductor device 210 is formed by disposing the semiconductor device 212 on the carrier 20 and then encapsulating the semiconductor device 212 and the conductive pillars 216 by the encapsulating material 214. In some embodiments, the semiconductor device 212 is attached or adhered over the carrier 20 through a die attach film 212c, or the like. The redistribution structure 220 is electrically connected to a plurality of electrical terminals 212a of the semiconductor device 212.

In some embodiments, a plurality of dielectric layers and redistribution circuit layers may be stacked on top of one another alternately to form the redistribution structure 220. In the present embodiment, the redistribution structure 220 at least includes a dielectric layer 222 and a redistribution circuit layer 224 electrically connected to the semiconductor device 212 and the conductive pillars 216. In one of the implementations, the dielectric layer 222 and the redistribution circuit layer 224 may be the topmost dielectric layer and the topmost redistribution circuit layer among the redistribution structure 220. In addition, the redistribution circuit layer 224 is disposed on top of the dielectric layer 222 as shown in FIG. 9 and the top surface of the redistribution circuit layer 224 may be substantially coplanar with the top surface of the dielectric layer 222. In some embodiments, the thickness of the dielectric layer 222 substantially ranges from 2 μm to 10 μm. The material of the dielectric layer 222 of the redistribution structure 220 may include organic polymer such as, but not limited to, polyimide, etc. The material of the redistribution circuit layer 224 may include copper, or any other suitable materials. In some embodiments, a redistribution structure 290 including at least one dielectric layer 292 and at least one redistribution circuit layer 294 may be formed on the carrier 20 before the encapsulated semiconductor device 210 is formed on the carrier 20.

Figure 10:
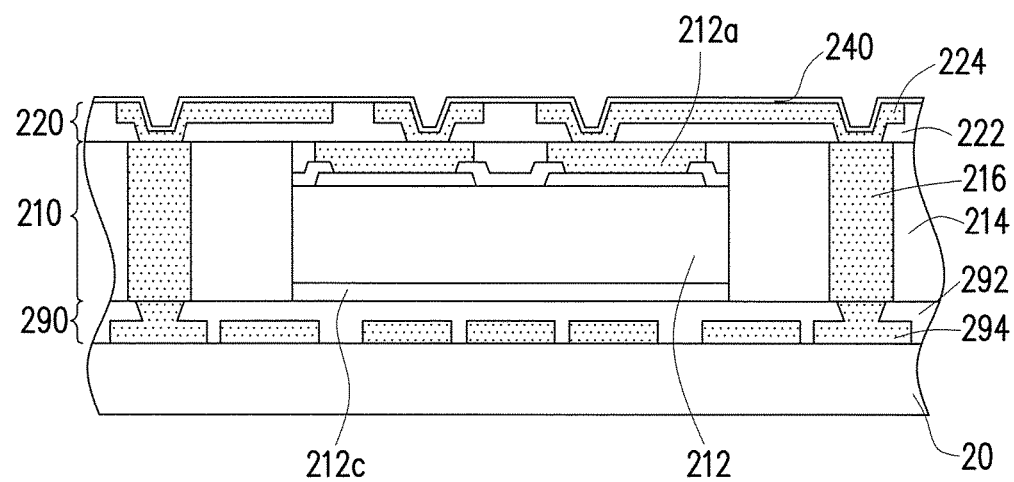

Referring to FIG. 10, in some embodiments, a protection layer 240 is formed on an upper surface of the redistribution structure 220. In the present embodiments, the protection layer 240 covers the upper surface of the redistribution structure 220 entirely. In other words, the protection layer 240 covers the top surface of the dielectric layer 222 and the top surface of the redistribution circuit layer 224.

Figure 11:
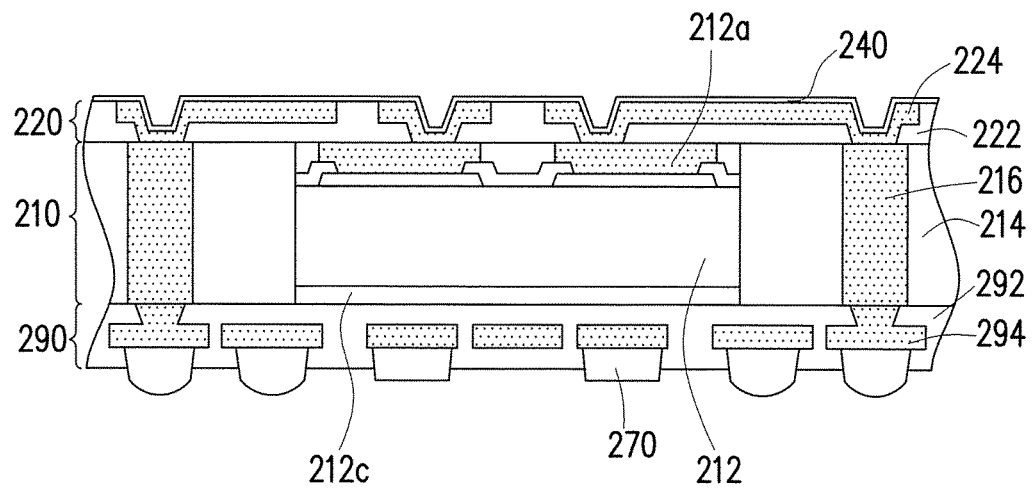

Referring to FIG. 11, the carrier 20 may be removed. In some embodiments, the carrier 20 is detached from the encapsulated semiconductor device 210 and the redistribution structure 290, by causing the de-bonding layer (not shown) on the carrier to lose or reduce adhesion. The de-bonding layer is then removed along with the carrier 20. For example, the de-bonding layer may be exposed to UV light, so that the de-bonding layer loses or reduces adhesion, and hence the carrier 20 and the de-bonding layer can be removed from the encapsulated semiconductor device 210 and the redistribution structure 290. Then, a plurality of electrical terminals 270 are formed on the redistribution structure 290 and electrically connected to the redistribution circuit layer 294.

Figure 12:
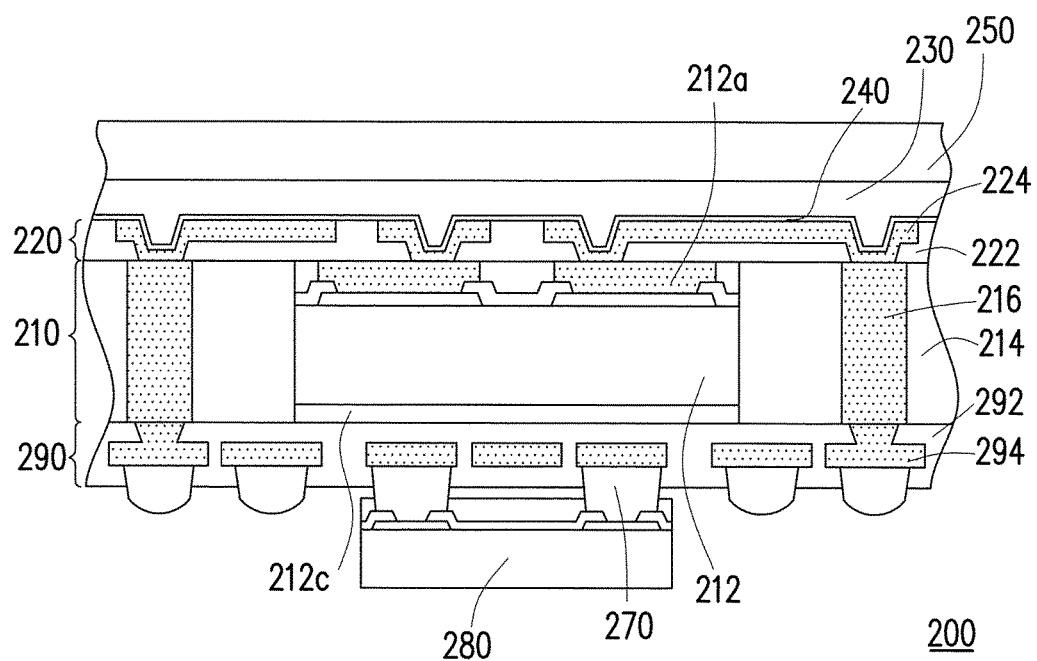

Referring to FIG. 12, an adhesive 230 is formed on the protection layer 240, and then an insulating cover 250 is disposed on the protection layer 240 through the adhesive 230. In other words, the adhesive 230 is disposed between the insulating cover 250 and the redistribution structure 220. In addition, a semiconductor device 280 may be mounted on the electrical terminals 270. In some embodiments, the semiconductor device 280 may be packages, device dies, passive devices, and/or the like, but the disclosure is not limited thereto. At the time, the manufacturing method of the semiconductor package 200 may be substantially done. In the present embodiment, the semiconductor device 212 may be a fingerprint sensor such as a capacitive fingerprint sensor, etc., and the protection layer 240 may function as the dielectric layer between the redistribution circuit layer 224 and the insulating cover 250 disposed thereon. In some embodiments, the insulating cover 250 may be a cover glass, but the disclosure is not limited thereto. In some embodiments, the protection layer 240 may be an inorganic protection layer 240, and includes inorganic material such as, but not limited to, aluminum oxide ($Al_2O_3$), silicon dioxide ($SiO_2$), or silicon nitride ($SiN_x$). In some embodiments, the protection layer 240 is formed by atomic layer deposition process, and the thickness thereof ranges from 100 Å to 200 Å. In one embodiment, the thickness of the protection layer 240 is about 150 Å, which is much thinner than the thickness of the regular dielectric layer (about 2 μm to 10 μm in thickness).

In general, the simplest form of a capacitor consists of two conductors, e.g. two metal plates, separated by an insulator. The following formula shows the parameters which influence capacitance C:

$$C = \varepsilon \frac{A}{d}$$

Where C is the capacitance; ε is the permittivity, also called dielectric constant of the insulating material between the plates; A is the area of the plates; d is the distance between the plates.

Therefore, by replacing conventional dielectric layer (e.g. organic polymer such as polyimide, etc.) with the protection layer 240, the thickness of the protection layer 240 (i.e. the distance d between the metal plates) reduces significantly.

For example, the thickness of the protection layer 240 is significantly reduced from about 7 μm (e.g. the thickness of a conventional dielectric layer) to about 150 Å (about 467 times thinner than the conventional dielectric layer), which is also attributed to achieve greater capacitance of the protection layer 240. In addition, the permittivity of the protection layer 240 (e.g. ε is about 8) is much higher than the permittivity of the conventional dielectric layer (e.g. ε is about 3). Accordingly, the capacitance of the protection layer 240 increases significantly.

Moreover, the equivalent capacitance of multiple capacitors (e.g. protection layer 240, adhesive 230, insulating cover 250, finger, etc.) connected in series can be stated as:

$$C_t = \frac{1}{\frac{1}{C_f} + \frac{1}{C_g} + \frac{1}{C_a} + \frac{1}{C_p}}$$

Where $C_t$ is the equivalent capacitance of capacitors; $C_f$ is the capacitance of a finger; $C_g$ is the capacitance of the insulating cover; $C_a$ is the capacitance of the adhesive; $C_p$ is the capacitance of the protection layer.

Therefore, since the capacitance of the protection layer 240 increases significantly by replacing conventional dielectric layer with the protection layer 240, the equivalent capacitance $C_t$ of the fingerprint sensor of the semiconductor package 200 also increases accordingly. Therefore, the semiconductor package 200 can provides fingerprint-sensing function with higher sensitivity.

In addition, owing to the oxygen and/or water vapor permeability of the protection layer 240 substantially lower than the oxygen and/or water vapor permeability of the dielectric layer 222, the configuration of the protection layer 240 can prevent oxygen and/or water vapor from contacting the redistribution circuit layers underneath. Accordingly, the configuration of the protection layer 240 can prevent the formation of copper oxide and the delamination between the dielectric layer 222 and the redistribution circuit layer 224, so as to improve yield rate of the semiconductor package 200.

In accordance with some embodiments of the disclosure, a semiconductor package includes an encapsulated semiconductor device, a redistribution structure, and a protection layer. The encapsulated semiconductor device includes a semiconductor device and an encapsulating material encapsulating the semiconductor device. The redistribution structure is disposed on the encapsulated semiconductor device and includes a dielectric layer and a redistribution circuit layer electrically connected to the semiconductor device. The protection layer at least covers the dielectric layer, wherein an oxygen permeability or a water vapor permeability of the protection layer is substantially lower than an oxygen permeability or a vapor permeability of the dielectric layer.

In accordance with some embodiments of the disclosure, a semiconductor package includes an encapsulated semiconductor device, a redistribution structure, and an inorganic protection layer. The encapsulated semiconductor device includes a semiconductor device and an encapsulating material encapsulating the semiconductor device. The redistribution structure is disposed on the encapsulated semiconductor device and includes a dielectric layer and a redistribution circuit layer electrically connected to the semiconductor device. The inorganic protection layer covers an upper surface of the redistribution structure.

In accordance with some embodiments of the disclosure, a manufacturing method of a semiconductor package includes the following steps. An encapsulated semiconductor device is formed on a carrier, wherein the encapsulated semiconductor device includes a semiconductor device and an encapsulating material encapsulating the semiconductor device. A redistribution structure is formed on the encapsulated semiconductor device, wherein the redistribution structure includes a dielectric layer and a redistribution circuit layer electrically connected to the semiconductor device. A protection layer is formed on an upper surface of the redistribution structure, wherein an oxygen permeability or a water vapor permeability of the protection layer is substantially lower than an oxygen permeability or a vapor permeability of the dielectric layer. The carrier is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    an encapsulated semiconductor device comprising a semiconductor device and an encapsulating material encapsulating the semiconductor device;
    a redistribution structure disposed on the encapsulated semiconductor device and comprising a dielectric layer and a redistribution circuit layer electrically connected to the semiconductor device, wherein the dielectric layer comprises an organic polymer; and
    a protection layer at least covering the dielectric layer, wherein an oxygen permeability or a water vapor permeability of the protection layer is substantially lower than an oxygen permeability or a vapor permeability of the dielectric layer.

2. The semiconductor package as claimed in claim 1, wherein the protection layer comprises inorganic material.

3. The semiconductor package as claimed in claim 1, wherein the protection layer comprises aluminum oxide ($Al_2O_3$), silicon dioxide ($SiO_2$), or silicon nitride (SiNx).

4. The semiconductor package as claimed in claim 1, further comprising an under bump metallization layer disposed on the redistribution circuit layer revealed by the dielectric layer and a conductive bump disposed on the under bump metallization layer and electrically connected to the redistribution circuit layer.

5. The semiconductor package as claimed in claim 4, wherein the protection layer covers the dielectric layer and the under bump metallization layer, and is disposed between the under bump metallization layer and the conductive bump.

6. The semiconductor package as claimed in claim 4, wherein the protection layer covers the dielectric layer and comprises an opening revealing the under bump metallization layer, the conductive bump is disposed on the under bump metallization layer revealed by the opening.

7. The semiconductor package as claimed in claim 1, further comprising an insulating cover disposed on the redistribution structure and an adhesive disposed between the insulating cover and the redistribution structure, wherein the protection layer covers the upper surface of the redistribution structure entirely and the semiconductor device is a fingerprint sensor.

8. The semiconductor package as claimed in claim 1, wherein a thickness of the protection layer ranges from 100 Ångström (Å) to 200 Å.

9. A semiconductor package, comprising:
an encapsulated semiconductor device comprising a semiconductor device and an encapsulating material encapsulating the semiconductor device;
a redistribution structure disposed on the encapsulated semiconductor device and comprising a dielectric layer and a redistribution circuit layer electrically connected to the semiconductor device;
an inorganic protection layer covering an upper surface of the redistribution structure;
an insulating cover disposed on the redistribution structure; and
an adhesive disposed between the insulating cover and the redistribution structure.

10. The semiconductor package as claimed in claim 9, wherein an oxygen permeability or a water vapor permeability of the inorganic protection layer is substantially lower than an oxygen permeability or a vapor permeability of the dielectric layer.

11. The semiconductor package as claimed in claim 10, wherein the inorganic protection layer comprises aluminum oxide ($Al_2O_3$), silicon dioxide ($SiO_2$), or silicon nitride (SiNx).

12. The semiconductor package as claimed in claim 10, further comprising an under bump metallization layer disposed on the redistribution circuit layer and a conductive bump disposed on the under bump metallization layer, wherein the inorganic protection layer covers the dielectric layer and is disposed between the under bump metallization layer and the conductive bump.

13. The semiconductor package as claimed in claim 10, wherein the inorganic protection layer covers the upper surface of the redistribution structure entirely and the semiconductor device is a fingerprint sensor.

14. A manufacturing method of a semiconductor package, comprising:
forming an encapsulated semiconductor device on a carrier, wherein the encapsulated semiconductor device comprises a semiconductor device and an encapsulating material encapsulating the semiconductor device;
forming a redistribution structure on the encapsulated semiconductor device, wherein the redistribution structure comprises a dielectric layer and a redistribution circuit layer electrically connected to the semiconductor device, wherein the dielectric layer comprises an organic polymer; and
forming a protection layer on an upper surface of the redistribution structure, wherein an oxygen permeability or a water vapor permeability of the protection layer is substantially lower than an oxygen permeability or a vapor permeability of the dielectric layer; and
removing the carrier.

15. The manufacturing method of the semiconductor package as claimed in claim 14, wherein the protection layer is formed by atomic layer deposition process.

16. The manufacturing method of the semiconductor package as claimed in claim 14, further comprising:
forming an under bump metallization layer on the redistribution circuit layer revealed by the dielectric layer; and
forming a conductive bump on the under bump metallization layer.

17. The manufacturing method of the semiconductor package as claimed in claim 16, wherein the protection layer is formed on the dielectric layer and the under bump metallization layer before the conductive bump is formed on the under bump metallization layer.

18. The manufacturing method of the semiconductor package as claimed in claim 16, wherein the protection layer is formed on the dielectric layer and the under bump metallization layer before the conductive bump is formed on the under bump metallization layer.

19. The semiconductor package as claimed in claim 18, wherein forming the protection layer on the upper surface of the redistribution structure further comprises forming an opening revealing the under bump metallization layer, and the conductive bump is disposed on the under bump metallization layer revealed by the opening.

20. The manufacturing method of the semiconductor package as claimed in claim 16, further comprising:
forming an adhesive on the protection layer, wherein the protection layer covers the upper surface of the redistribution structure entirely; and
disposing an insulating cover on the protection layer through the adhesive, wherein the semiconductor device is a fingerprint sensor.

* * * * *